United States Patent
Hack et al.

(10) Patent No.: US 11,170,709 B2
(45) Date of Patent: Nov. 9, 2021

(54) MULTI-MODE OLED DISPLAY

(71) Applicant: Universal Display Corporation, Ewing, NJ (US)

(72) Inventors: Michael Hack, Carmel, CA (US); Michael Stuart Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 16/993,713

(22) Filed: Aug. 14, 2020

(65) Prior Publication Data

US 2020/0372857 A1    Nov. 26, 2020

Related U.S. Application Data

(63) Continuation of application No. 16/197,406, filed on Nov. 21, 2018, now Pat. No. 10,777,125.

(60) Provisional application No. 62/590,702, filed on Nov. 27, 2017.

(51) Int. Cl.
| | |
|---|---|
| G09G 3/3208 | (2016.01) |
| H01L 27/32 | (2006.01) |
| G02B 1/10 | (2015.01) |
| H01L 51/52 | (2006.01) |
| H01L 33/00 | (2010.01) |
| H01L 51/00 | (2006.01) |
| G02F 1/19 | (2019.01) |
| H01L 33/44 | (2010.01) |

(52) U.S. Cl.
CPC ............ *G09G 3/3208* (2013.01); *G02B 1/10* (2013.01); *H01L 27/3232* (2013.01); *H01L 51/5203* (2013.01); H01L 27/3267 (2013.01); H01L 33/00 (2013.01); H01L 51/0097 (2013.01); H01L 51/5265 (2013.01); H01L 2251/5323 (2013.01)

(58) Field of Classification Search
USPC .......................................................... 345/76
See application file for complete search history.

(56) References Cited

U.S. PATENT DOCUMENTS

| | | | |
|---|---|---|---|
| 4,769,292 A | 9/1988 | Tang | |
| 5,247,190 A | 9/1993 | Friend | |
| 5,686,979 A * | 11/1997 | Weber | ...................... E06B 9/24 |
| | | | 349/96 |
| 5,703,436 A | 12/1997 | Forrest | |
| 5,707,745 A | 1/1998 | Forrest | |

(Continued)

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.

(Continued)

*Primary Examiner* — Chineyere D Wills-Burns
(74) *Attorney, Agent, or Firm* — Butzel Long

(57) ABSTRACT

Full color displays that include optical thin film layers with a controllable reflectance are provided. The layers allow for the overall transparency and display properties of each side of the display to be controlled, allowing for augmented reality displays virtual reality displays, two-sided signage, and the like.

21 Claims, 3 Drawing Sheets

(56) References Cited

U.S. PATENT DOCUMENTS

| | | |
|---|---|---|
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A * | 7/2000 | Forrest ............... H01L 51/5271 |
| | | 313/504 |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,042,615 B2 | 5/2006 | Richardson |
| 7,279,704 B2 | 10/2007 | Walters |
| 7,431,968 B1 | 10/2008 | Shtein |
| 7,968,146 B2 | 6/2011 | Wagner |
| 2003/0230980 A1 | 12/2003 | Forrest |
| 2004/0174116 A1 | 9/2004 | Lu |
| 2005/0236982 A1 * | 10/2005 | Nakayama ......... H01L 51/5271 |
| | | 313/506 |
| 2005/0260449 A1 * | 11/2005 | Walters ............. H01L 51/0088 |
| | | 428/690 |
| 2007/0132378 A1 * | 6/2007 | Cok .................. H01L 51/5284 |
| | | 313/506 |
| 2008/0054283 A1 * | 3/2008 | Min ..................... H01L 33/44 |
| | | 257/98 |
| 2008/0308819 A1 * | 12/2008 | Louwsma ............ H01L 27/322 |
| | | 257/89 |
| 2009/0294785 A1 * | 12/2009 | Cok .................. H01L 51/5262 |
| | | 257/98 |
| 2011/0310458 A1 * | 12/2011 | Lee ........................ E06B 9/24 |
| | | 359/270 |
| 2012/0126229 A1 * | 5/2012 | Bower ................... H01L 24/83 |
| | | 257/48 |
| 2012/0243219 A1 * | 9/2012 | Ohsawa ............. H01L 27/3209 |
| | | 362/230 |
| 2014/0339517 A1 * | 11/2014 | Park .................. H01L 51/5253 |
| | | 257/40 |
| 2014/0362429 A1 * | 12/2014 | Yokozeki ............. G02F 1/1506 |
| | | 359/267 |
| 2015/0333229 A1 * | 11/2015 | Seo .................... H01L 27/3213 |
| | | 257/89 |
| 2016/0103381 A1 * | 4/2016 | Ikeno ................. G09G 3/3473 |
| | | 349/58 |
| 2017/0062531 A1 * | 3/2017 | Hack ................... B81B 3/0083 |
| 2017/0221425 A1 * | 8/2017 | Lu ....................... G09G 3/3413 |
| 2017/0229663 A1 | 8/2017 | Tsai |
| 2017/0331065 A1 * | 11/2017 | Seo ..................... H01L 27/323 |
| 2017/0338432 A1 * | 11/2017 | Adamovich ........ H01L 51/5004 |
| 2019/0002759 A1 * | 1/2019 | D'Amico ............. H01L 33/502 |
| 2019/0074266 A1 * | 3/2019 | Andrews ............... H01L 23/60 |
| 2019/0181384 A1 * | 6/2019 | Forrest ................ G02B 3/0056 |
| 2019/0206309 A1 * | 7/2019 | Sun .................... H01L 27/3232 |

OTHER PUBLICATIONS

Baldo, et al., "Very high-efficiency green organic light-emitting devices based on electrophosphorescence", Applied Physics Letters, Jul. 5, 1999, 4 pages, vol. 75, No. 1, American Institute of Physics, Melville, NY, USA.

Switchable Transflector, TransFlector(TM), "Liquid Crystal Switchable Mirror" Brochure, KentOptronics, retrieved Jul. 19, 2017, 2 pages.

Park et al., "Switchable silver mirrors with long memory effects," Chem. Sci., 2015, 6, 596-602.

Slack, et al., "Metal hydride switchable mirrors: Factors influencing dynamic range and stability," Solar Energy Materials & Solar Cells 90 (2006) pp. 485-490.

Richardson, Thomas J., "New electrochromic mirror systems," Solid State Ionics 165 (2003) pp. 305-308.

* cited by examiner

MULTI-MODE OLED DISPLAY

CROSS-REFERENCE TO RELATED APPLICATIONS

This application is a continuation of U.S. patent application Ser. No. 16/197,406, filed Nov. 21, 2018, which is a non-provisional, and claims the priority benefit, of U.S. Provisional Patent Application Ser. No. 62/590,702, filed Nov. 27, 2017, the entire contents of which are incorporated herein by reference.

FIELD

The present invention relates to devices that include LEDs such as organic light emitting diodes and controllable-reflectance optical thin film layers.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
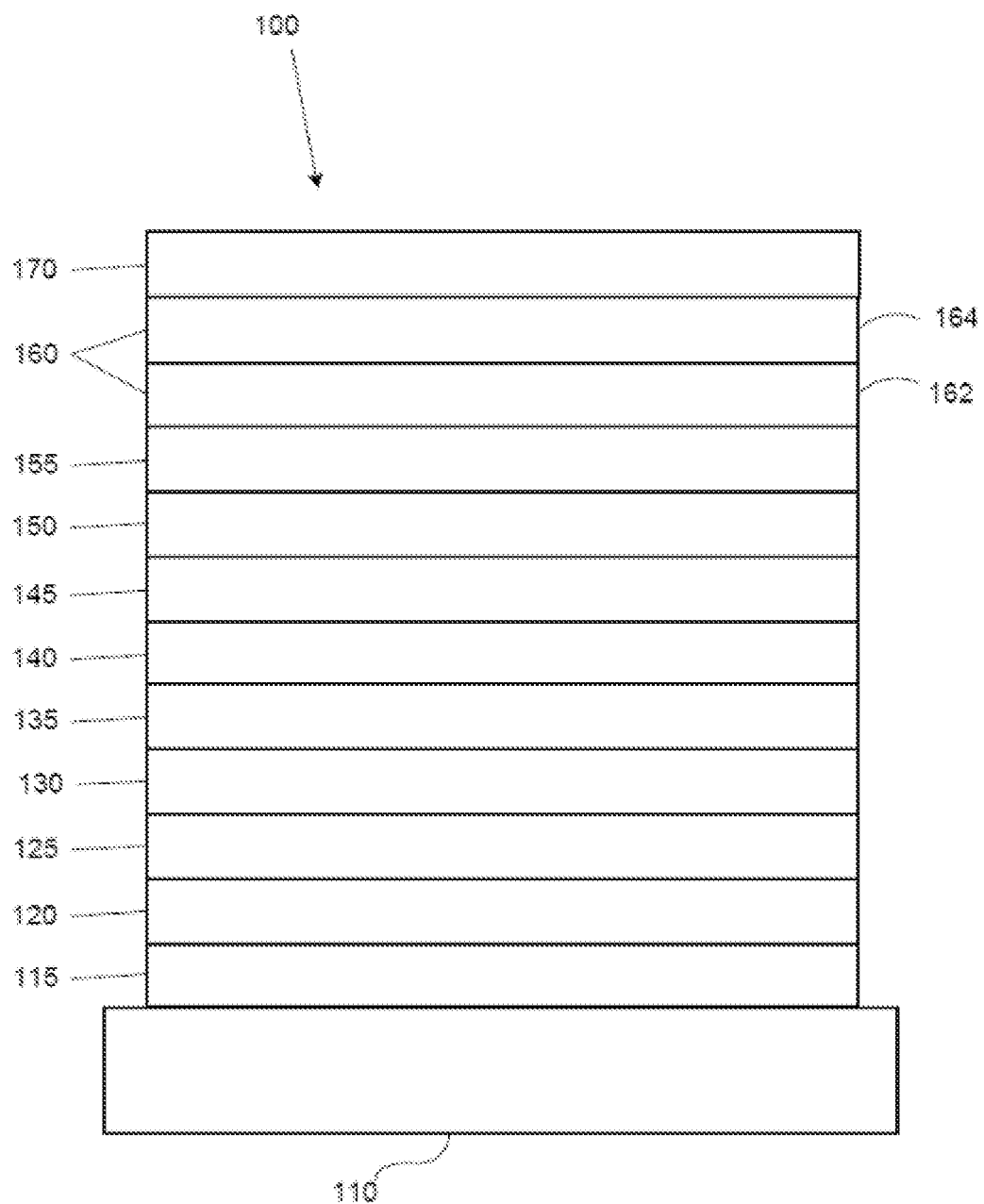
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
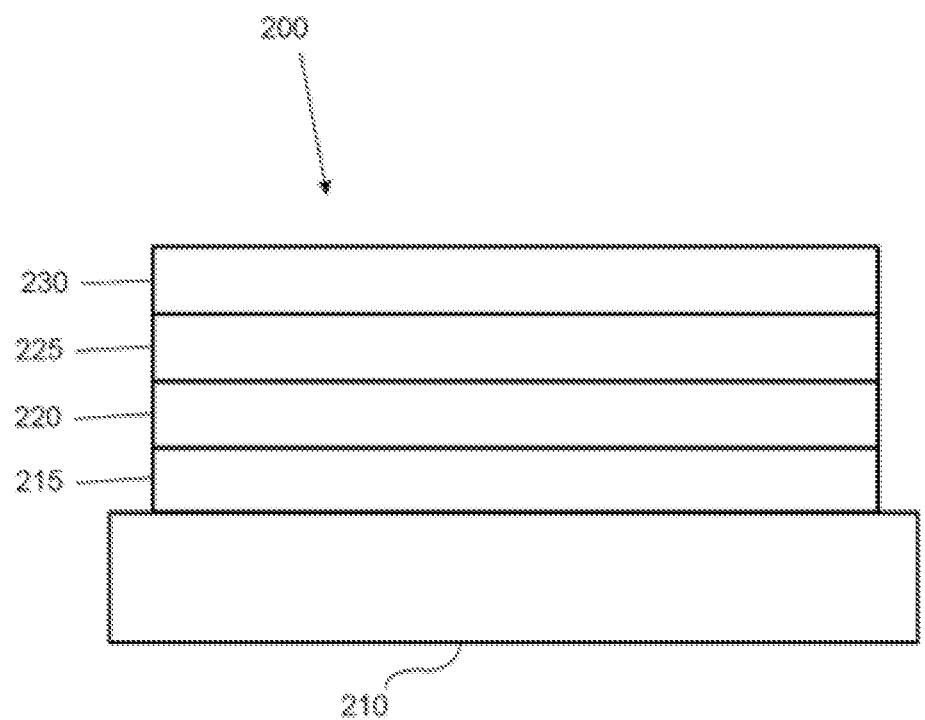
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, displays as disclosed herein may incorporate LEDs and optical thin film layers with controllable reflectance, such as switchable thin-film mirrors, or OLEDs or other components that include such layers, to provide multi-mode displays that may have controllable transparency and emission characteristics. For example, displays as disclosed herein may be switchable among different modes that are transparent, transparent with one-sided emission, transparent with two-sided emission, and on one or two sided emission with no transparency, and/or partially transparent and/or emissive on one or both sides. In addition to having a wide variety of uses including controllable virtual reality (VR) and/or augmented reality (AR) displays, such devices also may increase display efficiency, such as for outdoor applications, without requiring the use of a polarizer or comparable device or layer. Displays disclosed herein may allow for use of the same display in multiple applications. For example, in a VR application it may be desirable for the display to be non-transparent and for OLEDs in the display to exhibit cavity design properties so as to fully immerse the user in the VR experience. In some cases the user may wish to alter the display to operate in an AR mode or otherwise have some or complete visibility of the surrounding environment through the display. Similarly, it may be desirable for signage or other OLED display applications to be switchable among different modes that allow for display of images on one or both sides, while being transparent, semi-transparent, or non-transparent.

As another example, indoor and outdoor requirements for displays often are different. Indoor usage often requires that a display have a very good color gamut but may not require high brightness. In contrast, brightness and contrast typically is more important for outdoor applications than high color purity. These two sets of requirements can be met in a single switchable device as disclosed herein by incorporating an opaque or non-reflective layer under the LED, such as incorporated into or adjacent to the anode. When used outdoors, the lack of reflection from the LED anode or backplane circuitry, and associated lack of cavity effects results in a less saturated blue that can be employed to increase display brightness and efficiency. When used indoors, the anode in the same device can be made reflective as disclosed herein, thereby allowing for cavity effects to produce a deep saturated blue. This approach also may remove the need for circular polarizers and similar structures to remove reflections from the display when used outdoors. For example, an integrated sensor could measure ambient lighting and adjust the display mode accordingly. Similarly, an integrated sensor also may be used in transparent signage displays, to switch between transparent and one-sided emission modes depending on the relative positions of viewers.

Embodiments disclosed herein provide for these various applications by including components that allow for changing optical properties of an electrode in a display, such as the reflectivity and/or transparency of the anode and/or the cathode electrode that is part of an OLED stack or similar structure in each sub-pixel.

Various technologies have been developed to provide switchable mirrors, which may be suitable to provide a controllable-reflectance optical thin film layer as disclosed herein. Such techniques include electrowetting approaches, electrophorectic approaches and liquid crystal solutions. The switching speeds of switchable mirrors fabricated with such technologies typically are on the order of one to a few seconds, so they cannot respond at display frame rate speeds. However, the technologies still may be suitable to change the operational mode of a display as disclosed herein. Given the unique nature of OLED technology and OLED displays, the use of switchable mirrors or other controllable-reflectance optical thin film layers as disclosed herein with OLED displays may be particularly suitable for making transparent displays that are controllable to emit light from one or both sides on demand, as well as providing for control of the overall display transparency. As used herein, an optical thin film layer is a "controllable reflectance" layer if the optical properties of the layer are adjustable via an electrical signal, such as with a switchable mirror. For embodiments disclosed herein a layer having a controllable reflectance generally also will have a controllable transmission, since light that is not reflected by the layer typically will be transmitted, though in some cases a small portion of light may be absorbed within the layer, scattered to a side of the device, or the like.

Figure 3:
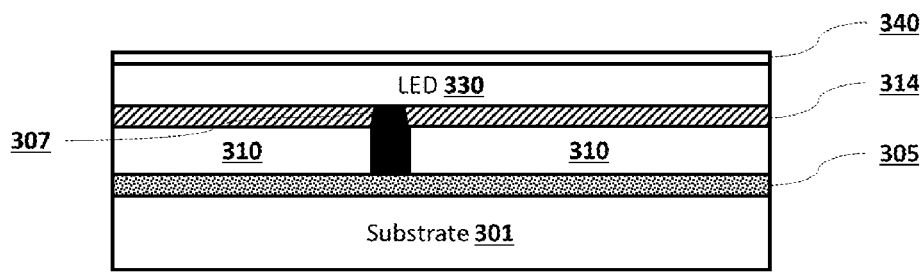
FIG. 3 shows a device including a controllable-reflectance optical thin film layer according to an embodiment disclosed herein.
Figure 4:
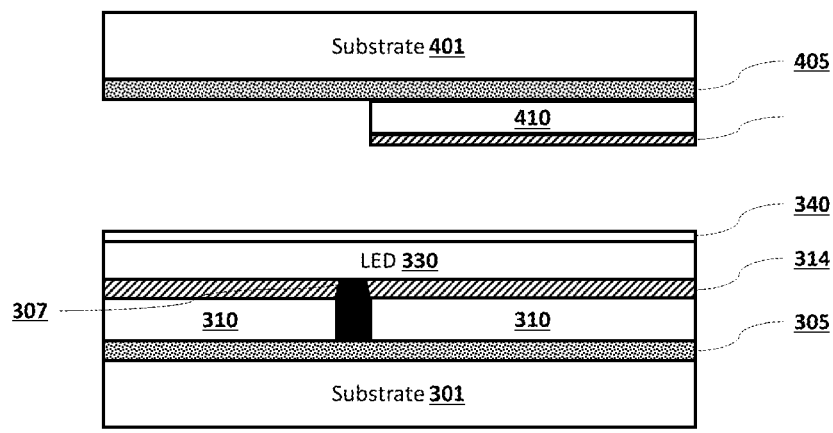
FIG. 4 shows a device including a controllable-reflectance optical thin film layer according to an embodiment disclosed herein.

FIG. 3 shows an example arrangement that integrates a controllable-reflectance optical thin film layer in a display according to an embodiment disclosed herein. FIG. 4 shows an exploded view of a device as disclosed herein that includes an additional controllable-reflectance optical thin film layer disposed over a second substrate.

A controllable-reflectance optical thin film layer 310 may be incorporated into an LED stack 330 disposed over a substrate 301, or otherwise in a stack with an OLED or other component in a display. The layer 310 may include one or more switchable mirrors as disclosed herein. The layer 310 may extend over the entirety of the LED in a particular sub-pixel, or it may be disposed over only a portion of the LED 330 that is less than the entire LED. The controllable-reflectance layer 310 and/or each component of the layer (such as individual switchable mirrors within the layer) may be controllable between various states of reflectance and transmittance of light in the spectrum emitted by the LED 330. For example, where the LED 330 emits light in the visible spectrum, the controllable-reflectance layer 310 may be controllable to reflect or transmit light within the visible spectrum, or within the portion of the visible spectrum corresponding to the light emitted by the LED. The controllable-reflectance layer may be controllable between two states, such as a most reflective state and a least reflective state, or a most reflective state and a most transmissive state, or the like. More generally, the layer may be controllable to have a reflectance and/or transmittance within any operating range of the layer. In an embodiment, the controllable-reflectance layer may be at least 40% reflective in a most reflective state, and at least 40% transmissive in a most transmissive state. The most transmissive state also may correspond to a least reflective state and vice versa, such that the portion of light not reflected is transmitted, and the portion not transmitted is reflected in each state. Other ranges of transmittance and reflectance may be used, such as a maximum reflectance/transmittance of 50%, 60%, 70%, 80%, 90%, or up to 100%, within the limits of materials suitable for use with an LED- or OLED-based device as disclosed in further detail herein. Furthermore, other modes may be used, such as modes in which one or both sides of the display are made partially transmissive, partially opaque, and/or partially reflective. Such configurations may be useful, for example, in AR applications in which a user may wish to see both an image generated by the display and the environment on the other side of the display.

A via 307 provides a connection path between a backplane layer 305, which may include conventional control circuitry as well as an interface to the controllable-reflectance layer 310. A planarizing layer may be disposed over the controllable-reflectance layer 310. The LED 330 may be a microLED or an OLED have any configuration, including any number of emissive layers, blocking layers, transport layers, and the like, such as those described with respect to FIGS. 1 and 2. More generally, as used herein a light-emitting diode ("LED") may refer to an inorganic LED such as a microLED, an organic LED, an electroluminescent quantum dot, or the like. Displays may use organic LEDs, inorganic LEDs, or a combination of inorganic and organic LEDs, such as where some sub-pixels in a device are inorganic and some sub-pixels are organic.

One or more encapsulation, permeation, and/or passivation layer or other protective layer 340 may be disposed between the LED 330 and the controllable-reflectance layer or layers 310, 410, for example to prevent the LED 330 from being damaged by chemicals leaking out of mirrors in the layer(s) 310, 410.

In a configuration as shown in FIG. 4, controllable-reflectance layers 310, 410 may be integrated into both the LED substrate 301 and a cover substrate 401 on which addressing lines 405, and/or additional electrode(s) 450 may be fabricated prior to placing over the first substrate 301. The controllable-reflectance layers 310, 410 may be arranged relative to one another to allow for specific effects, such as cavity effects, to be achieved in the device. For example, the layers may be arranged to allow for a quarter-wavelength, half-wavelength, or full-wavelength cavity to be formed based upon a primary color or set of colors emitted by the LED component 330. It may be preferred for the layers 310, 410 to be separated by at least 130 nm, 260 nm, or 520 nm. It also may be desirable for the controllable-reflectance layer or layers to be selected to achieve particular effects. For example, a controllable-reflectance layer 310 as shown in FIGS. 3 and 4 may be disposed a distance equal to one quarter wavelength of a peak color emitted by the LED 330. As a specific example, it may be desirable for the distance from the closest planar interface of an emissive layer of the LED 330 to be about 65 nm from the controllable-reflectance optical thin film layer 310.

Each controllable-reflectance layer may be in electrical communication with a controller. The layers 310, 410 may have a common controller, or each may have a separate controller that controls the reflectance level of each layer. To adjust the LED stack properties from transparent to one-sided emission, switchable mirrors or other components in the controllable-reflectance layer 410 may be aligned to sub-pixels in the display. For example, on the LED substrate 301 the controllable-reflectance regions 310 may be patterned under the sub-pixel stacks 330 as shown, and/or they may be located adjacent to the sub-pixel stacks 330. Depending on the display mode to be realized, the controllable-reflectance layers may be controlled for all pixels at the same time. For example, all pixels may be controlled concurrently when changing a cavity OLED display to a non-cavity OLED display, for the whole display to transition from outdoor to indoor use, with the controllable-reflectance layer being continuous across the entire display active area. For example, a single switchable mirror layer may be used across all pixels of the device. As another example, to change a VR display to an AR display, it may be desirable to change the state of the controllable reflectance layer 310 across the entire display at the same time, but the layer may or may not have a continuous mirror or similar component across the display. A mirror may be patterned into regions that correspond to the positions of the LEDs or regions between the LEDs. In other use conditions, it may be desirable to change the reflectance and/or transparency of only specific rows of pixels when the display mode is changed, such as to transition from one-sided emission to two-sided emission.

As previously disclosed, in some cases it may be desirable for a display to produce images from both display surfaces, such as for general signage applications. It also may be desirable for the images displayed on either side of the display to be independent and distinct, or for one image to be the mirror image of the other, so both can be viewed correctly from either side of the display. This may be achieved by having two sets of pixels for each row in the display, with each set of pixels having its own scan line, and each set of pixels designed to emit light from a different surface of the display. One set of pixels for each row may have a controllable-reflectance layer as disclosed herein patterned adjacent to the anodes for that row. For example, one set of pixels in each row may have the controllable-reflectance layer patterned under OLED pixels on the OLED substrate. The second set of pixels for each row may have a controllable-reflectance layer patterned adjacent to the cathodes for that row, such as by being patterned on an OLED cover or similar component, such as the cover substrate 401 in FIG. 4. The controllable-reflectance layers may be patterned to include one entire row at a time and controlled accordingly, in which case simple addressing may be used. Alternatively or in addition, only the portion of the controllable reflectance layer in each row that is inline with an LED or comparable structure may be switched to change modes, although all the regions in each row also may be switched together. In other configurations, a controllable-reflectance optical thin film layer as disclosed herein may be disposed in a common plane with the LED or a portion of the LED. For example, a controllable-reflectance layer such as a switchable mirror may be disposed adjacent to, and in a common plane with at least a portion of, the LED 330 shown in FIGS. 3 and 4. By adjusting which set of rows has reflective or more reflective anodes as opposed to transparent anodes and similarly same for the corresponding cathodes, it is possible to select which LEDs emit light and in which direction from the display. By adjusting the data signals appropriately, two different images can be rendered by the display from each side of the display by making all the cathodes reflecting for one set of rows, and all the anodes reflecting in the other set of pixel rows, or vice-versa.

To avoid parallax issues, it may be desirable for the controllable-reflectance layer to be placed relatively close to the OLED cathode(s), or the top surface of the OLED, preferably at a distance less than the distance between pixels in the device.

In some arrangements and use cases, it may be desirable for the device to be programmed and configured such that the controller adjusts the reflectivity of the controllable-reflectance optical thin film layer based upon the ambient environment. For example, the mode (and hence the reflectance and/or transmittance) of the layer may be controlled based upon a detected ambient luminance, such as to provide a more transparent display when the ambient light level is higher or lower than average. Furthermore, an attribute of the display itself may be adjusted by controlling the reflectance of one or more controllable-reflectance layers in the device as disclosed herein. For example, the color gamut, optimal or available viewing angle, average display transparency, total emitted luminance, or other attributes of the display may be changed by controlling the transparency of one or more layers. As a specific example, the color gamut of a display as disclosed herein may be adjusted by altering the reflectance of the OLED anode so as to change the length of the optical cavity within the OLED and the optimum viewing angle. As another example, the transmission of a cathode may be altered to change the overall luminance of the display.

The materials used to fabricate switchable mirrors as disclosed herein or other controllable-reflectance layers and components, as well as intermediate layers, may be chosen so as to enhance outcoupling from the OLED 330 when the components are in a transparent state. For example, materials may be chosen to be refractive index matched to the OLED, or to have refractive indices that are close to the OLED so as to prevent loss of light to side emission, waveguided modes, and the like.

A display as disclosed herein may be fabricated using a variety of display arrangements, such as side-by-side RGB inorganic or OLED pixels, white pixels with color filters, or yellow and blue OLEDs and/or inorganic LEDs, with color filters or altering layers to produce green and red sub-pixels. Furthermore, a hybrid display architecture that incorporates both organic and inorganic sub-pixels may be used, such as arrangements in which blue microLEDs (at lower than display resolution) are combined with other colors of OLEDs to produce a full-color display. In such an arrangement, the OLEDs may be patterned red and green OLEDs, or unpatterned yellow OLEDs with green and red color filters or color altering layers.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a first substrate;
   a light-emitting diode (LED) disposed over the substrate; and
   a first controllable-reflectance optical thin film layer disposed in a stack with the LED and in optical communication with the LED, the first controllable-reflectance optical thin film layer having a reflectivity controllable by an electrical signal provided by a first controller, wherein the first controllable-reflectance optical thin film layer is at least 10% reflective in a most reflective state and at least 10% transmissive in a most transmissive state.

2. The device of claim 1, further comprising:
   a second controllable-reflectance optical thin film layer disposed over at least a portion of the LED, the second controllable-reflectance optical thin film layer having a variable reflectivity controllable by an electrical signal provided by a second controller.

3. The device of claim 2, wherein the second controllable-reflectance optical thin film layer is disposed over a portion of the LED less than the entire LED.

4. The device of claim 1, further comprising:
   a third controllable-reflectance optical thin film layer disposed over the first substrate and adjacent to the LED.

5. The device of claim 1, wherein the LED is a type of device selected from a group consisting of: an inorganic LED, an organic LED (OLED), a microLED, and an electroluminescent quantum dot.

6. The device of claim 1, wherein the first controller is configured to adjust the reflectivity of the first controllable-reflectance optical thin film layer based upon an ambient luminance.

7. The device of claim 1, wherein the device is at least one type selected from the group consisting of: a flat panel display, a computer monitor, a medical monitor, a television, a billboard, a light for interior or at least one of exterior illumination and/or signaling, a heads-up display, a fully or partially transparent display, a flexible display, a laser printer, a telephone, a mobile phone, a tablet, a phablet, a personal digital assistant (PDA), a wearable device, a laptop computer, a digital camera, a camcorder, a viewfinder, a micro-display having an active area with a primary diagonal of 2 inches or less, a 3-D display, a virtual reality or augmented reality display, a vehicle, a video wall comprising multiple displays tiled together, a theater or stadium screen, and a sign.

8. The device of claim 7, wherein the device has at least one adjustable attribute that varies based upon the configuration of a plurality of controllable-reflectance optical thin film layers in the device.

9. The device of claim 8, wherein the attribute is selected from the group consisting of: a color gamut, a viewing angle, an average transparency, and a total luminance.

10. A transparent display device comprising:
    an array of a plurality of pixels, each pixel of the plurality of pixels comprising:
    one or more light emitting diodes (LEDs) disposed over a substrate; and
    a controllable-reflectance optical thin film layers disposed in a stack with the one or more LEDs and in optical communication with the one or more LEDs, wherein a transmission of the controllable-reflectance optical thin film layer is adjustable by at least a factor of two.

11. The transparent display device of claim 10, wherein an overall transparency of the display results at least in part from a selected transmission of the controllable-reflectance optical thin film layers.

12. The transparent display device of claim 10, wherein light emitted by each of the plurality of pixels is directed primarily in one direction perpendicular to the substrate.

13. The transparent display device of claim 12, wherein the transmission of each of the controllable-reflectance optical thin film layers is adjustable across a range including a transmission of less than 10% to a transmission greater than 20%.

14. The transparent display device of claim 10, wherein light emitted by each of the plurality of pixels is primarily directed in two directions perpendicular to the substrate.

15. The transparent display device of claim 14, wherein the transmission of each of the controllable-reflectance optical thin film layers is adjustable across a range including a transmission of less than 10% to a transmission greater than 20%.

16. The transparent display device of claim 10, wherein light emitted by each of the plurality of pixels is directed in a direction controlled by the transmission of the controllable-reflectance optical thin film layer in the pixel to select between one-sided emission and two-sided emission.

17. The transparent display device of claim 16, wherein the transmission of each of the controllable-reflectance optical thin film layers is adjustable across a range including a transmission of less than 10% to a transmission greater than 20%.

18. The transparent display device of claim 16, wherein each pixel comprises a plurality of sub-pixels configured to emit light of three primary colors.

19. The transparent display device of claim 18, wherein the three primary colors comprise red, green, and blue.

20. The transparent display device of claim 10, wherein the transparent display device is a full-color device.

21. The transparent display device of claim 10, wherein the LED is a type of device selected from a group consisting of: an inorganic LED, an organic LED (OLED), a microLED, and an electroluminescent quantum dot.

* * * * *